United States Patent [19]

Earl et al.

[11] Patent Number: 5,304,735
[45] Date of Patent: Apr. 19, 1994

[54] HEAT SINK FOR AN ELECTRONIC PIN GRID ARRAY

[75] Inventors: George F. Earl, Meredith; Jeffrey J. Panek; Jack Churchill, both of Laconia; Henry F. Villaume, Intervale, all of N.H.

[73] Assignee: Aavid Engineering, Inc., Laconia, N.H.

[21] Appl. No.: 998,877

[22] Filed: Dec. 29, 1992

Related U.S. Application Data

[63] Continuation of Ser. No. 835,773, Feb. 14, 1992, abandoned.

[51] Int. Cl.$^5$ .............................................. H05K 7/20
[52] U.S. Cl. .................................... 174/16.3; 24/555; 248/510; 257/718; 361/703; 361/718
[58] Field of Search ............... 174/16.3; 257/706, 707, 257/718, 719; 24/455–458, 556, 625, 543, 555, 316.7; 361/382, 383–386, 400, 403, 405, 417, 419, 420, 427, 689, 690, 703, 704, 709, 717, 718, 722, 702, 760, 763, 773, 807, 809, 810, 825; 248/72, 228, 505, 506, 510, 316.7

[56] References Cited

U.S. PATENT DOCUMENTS

| | | | |
|---|---|---|---|
| 3,617,980 | 6/1970 | Alkire | 174/52.1 |
| 4,575,038 | 3/1986 | Moore | 248/505 |
| 4,587,595 | 5/1986 | Staples | 361/388 |
| 4,803,545 | 2/1989 | Birkle | 357/81 |
| 4,814,584 | 3/1989 | Bohlender et al. | 338/22 R |
| 4,933,746 | 6/1990 | King | 357/81 |
| 5,040,096 | 8/1991 | Churchill | 357/79 |
| 5,099,550 | 3/1992 | Beane et al. | 24/555 |
| 5,170,325 | 12/1992 | Bentz | 361/388 |

Primary Examiner—Gerald P. Tolin
Attorney, Agent, or Firm—Fish & Richardson

[57] ABSTRACT

A heat sink in adapted to be attached to a pin grid array comprising a pair of grooves extending along opposite sides into which grooves the tops of attachment clips are disposed. The heat sink has a pair of indentations on opposite sides of each clip holds each clip in place in the groove, the heat sink with the clips attached being positioned between two compression sections of a pair of attachment pliers and when a pin grid array is positioned adjacent to the heat sink, compression of the plier handles connects the clips to the pin grid array. Removal is accomplished by a pair of pliers having projecting points which fit beneath the clips so that compression of the plier handles forces the clip away from the pin grid array disconnecting it.

4 Claims, 5 Drawing Sheets

HEAT SINK FOR AN ELECTRONIC PIN GRID ARRAY

This is a continuation of application Ser. No. 07/835,773 filed Feb. 14, 1992, now abandoned.

FIELD OF THE INVENTION

This invention relates to a attaching and removing a clip-heat sink subassembly used with a semi-conductor device.

BACKGROUND OF THE INVENTION

Microprocessors and other semiconductor devices are often packaged in what is called pin grid arrays ("PGA"). These are actually very small boards of many circuits having a great many conductive contacts or pins by which they may be electrically connected to a much larger printed circuit board. In most cases, the pin grid array contains a large number of pins densely packed together, and when attached, the pins of the pin grid array are usually soldered to the printed circuit board or connected through a socket. A heat sink is often removably connected to the pin grid array to dissipate the heat generated by the semiconductor when in use. The heat sink may be attached to the pin grid array by some form of removable clip or clamp so that the heat sink may be removed from the pin grid array package or other semiconductor package. Because of space requirements on the boards, these PGA's or semiconductor packages are usually spaced as close as possible. As a result, it is often difficult for an assembler to physically position the several small clips used to attach the heat sink to the pin grid array, while properly aligning the heat sink and pin grid array, all at the same time. Moreover, the situation becomes even worse in trying to remove the connectors once the pin grid array is installed on the printed circuit board.

Because of the soldering that would be involved in attaching and removing the pin grid array, it is sometimes necessary to remove and re-attach the heat sink to the pin grid array after the latter is mounted on the board, without removing the pin grid array from the board itself. Unfortunately, the epoxy method (most common) for attaching heat sinks to pin grid arrays means that it cannot be easily separated when the pin grid array is soldered to the printed circuit board. Some clamps for attaching heat sinks to PGA's are small and difficult to properly grasp and/or position in the environment of a crowded assembled printed circuit board. Often, there is not enough room between the pin grid array and other components on the board for the assembler to hold and attach any of the prior art connectors, and as the connectors are sometimes made of metal, if they are dropped or become loose on the board itself, they could short out other expensive electronic devices.

An added problem with the prior art attachment and removal procedures is that they involve applying a downward force on the printed circuit board, which is undesirable. The boards during assembly are generally supported on opposite sides by rails, thereby permitting them to flex in the middle. Such a flexing, as is caused by this downward force, tends to stretch and possibly break the electrical traces on the board, particularly those that extend across the board between the rails. Consequently, besides lack of space problems in attaching or removing a heat sink to a pin grid array mounted on a board, the assembler must be very careful not to flex the board.

Accordingly, an object of the invention is to provide a means by which a heat sink may be easily attached to and removed from a pin grid array or other device while on the board.

Another object of the invention is to provide a heat sink which holds the clip/clips in place as if the heat sink and clips were a single unit.

Another object of the invention is to provide a tool for easily installing a connector for attaching a heat sink to a pin grid array or other device without flexing any printed circuit board to which the pin grid array or other device may already be attached.

Another object of the invention is to provide a tool for easily removing the clip for attaching a heat sink to a pin grid array or other device.

SUMMARY OF THE INVENTION

The invention here comprises a groove on the sides of a heat sink, which groove has at least two deformations so that an attachment clip can be slipped onto the groove where it is held in place by the deformation on either side such that in assembling the heat sink to a pin grid array or other device, the heat sink and attachment clips act as a single unit for the assembler. Further, the invention includes a pair of assembly pliers, which act to grasp the heat sink (with the attached clips held in place in the heat sink grooves) and the pin grid array as a single unit, the pliers aligning and compressing the clips so that they connect the heat sink to the pin grid array in one operation without flexing or applying downward pressure to any attached printed circuit board. The invention also includes a pair of removal pliers with narrow, specially configured points designed to grasp and remove such clips even when the pin grid array is connected to a densely-packed printed circuit board.

In the preferred embodiment, an attachment clip of the general type disclosed in U.S. patent application No. 07/609,265 filed Nov. 5, 1990, now U.S. Pat. No. 5,099,550, is used. The clip has a generally "C" shaped cross section, with the top of the "C" having a rounded top to receive the heat sink and a lower ledge to grasp the pin grid array. The clip is attached by inserting the top into the heat sink and then compressing the clip so that its lower ledge deflects to secure the pin grid array. The preferred clip, however, is modified to have a length of about one-half inch so that it grasps any heat sink and any pin grid array over that length. The heat sink is constructed so that it has a groove along at least two opposite sides, the grooves configured to accept the top of the clip. The clip is inserted into the groove by aligning its top with one of the open ends of the groove and sliding it into the groove. The groove has a deformity at a preselected point, by which the clip cannot slide. A second deformity is then made on the opposite side of the clip thereby holding it in place in the groove. As a result, an assembler does not have to hold and try to align separate, small clips with the heat sink when attempting to assemble the entire package.

In the preferred embodiment, a pair of attachment pliers comprises a pair of blocks designed to position and hold a heat sink. The pliers also include on each point a concave indentation designed to fit over one of the clips when the heat sink is seated by the blocks. In operation, the blocks position the heat sink with the clips disposed in grooves on opposite sides. The concave indentations hold the clips. As a result, that portion of the entire package is effectively held by the one hand of the assembler, which is actually holding the pliers. The assembler may then position the pin grid array over the heat sink, and by squeezing the pliers, the clips are compressed so as to secure them to the pin grid array, as described above.

Also in the preferred embodiment, a pair of removal pliers comprises a pair of working points which project towards each other. The points are narrow so as to fit between the clips and the heat sink and/or pin grid array. When so positioned in operation, squeezing the handles of the pliers together force the points under the clip, which pulls it away from the pin grid array thereby disconnecting the clip. At the same time, the pliers grasp the clip so that it cannot fall onto the printed circuit board.

DESCRIPTION OF THE PREFERRED EMBODIMENT

We now turn to a description of the preferred embodiments, after first briefly describing the drawings.

Figure 2:
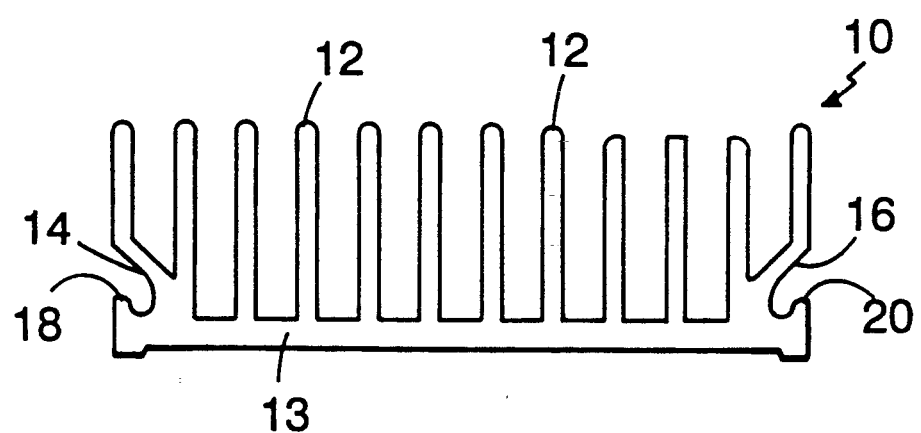
FIG. 2 is an enlarged side view of the heat sink of FIG. 1, showing a pair of side grooves.
Figure 3A:
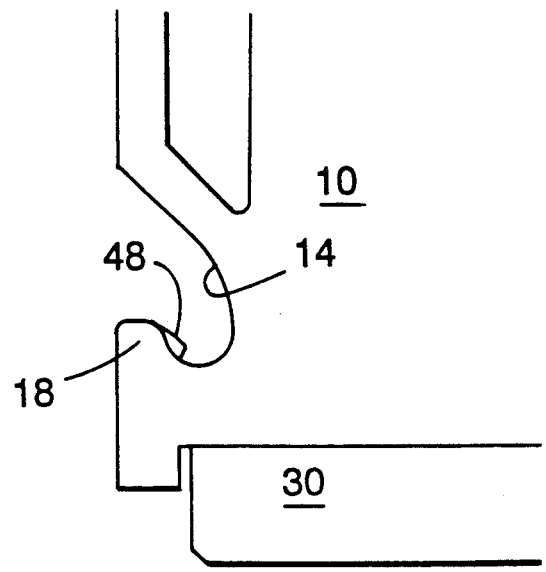
Figure 3B:
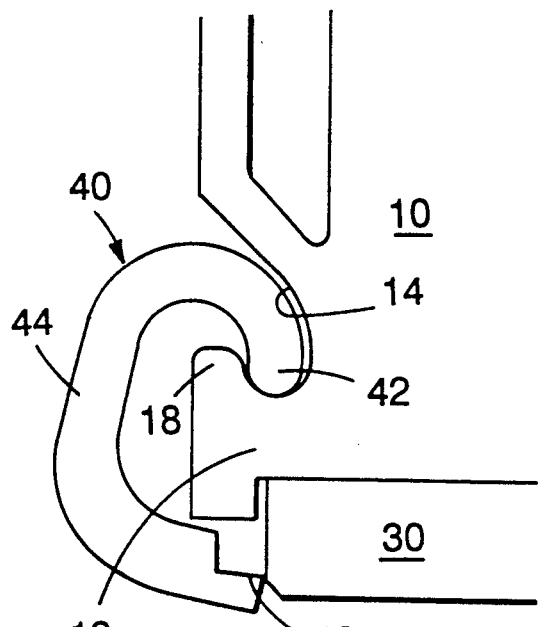
Figure 3C:
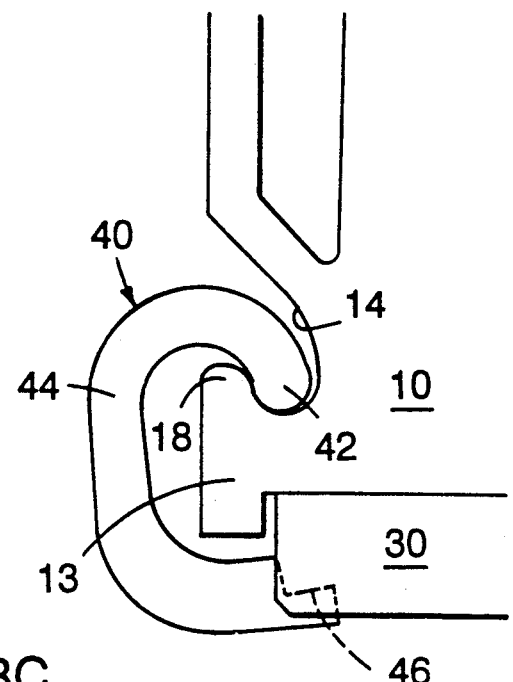
Figure 4:
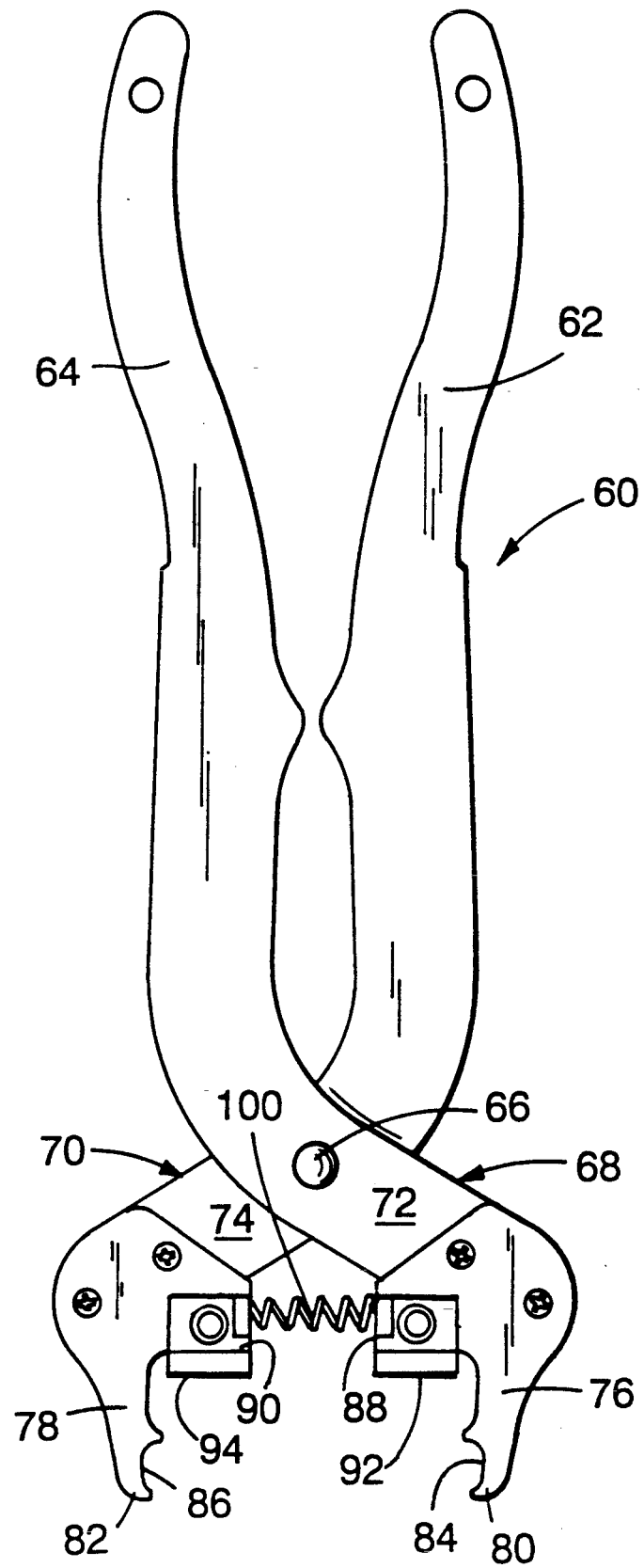
Figure 5:
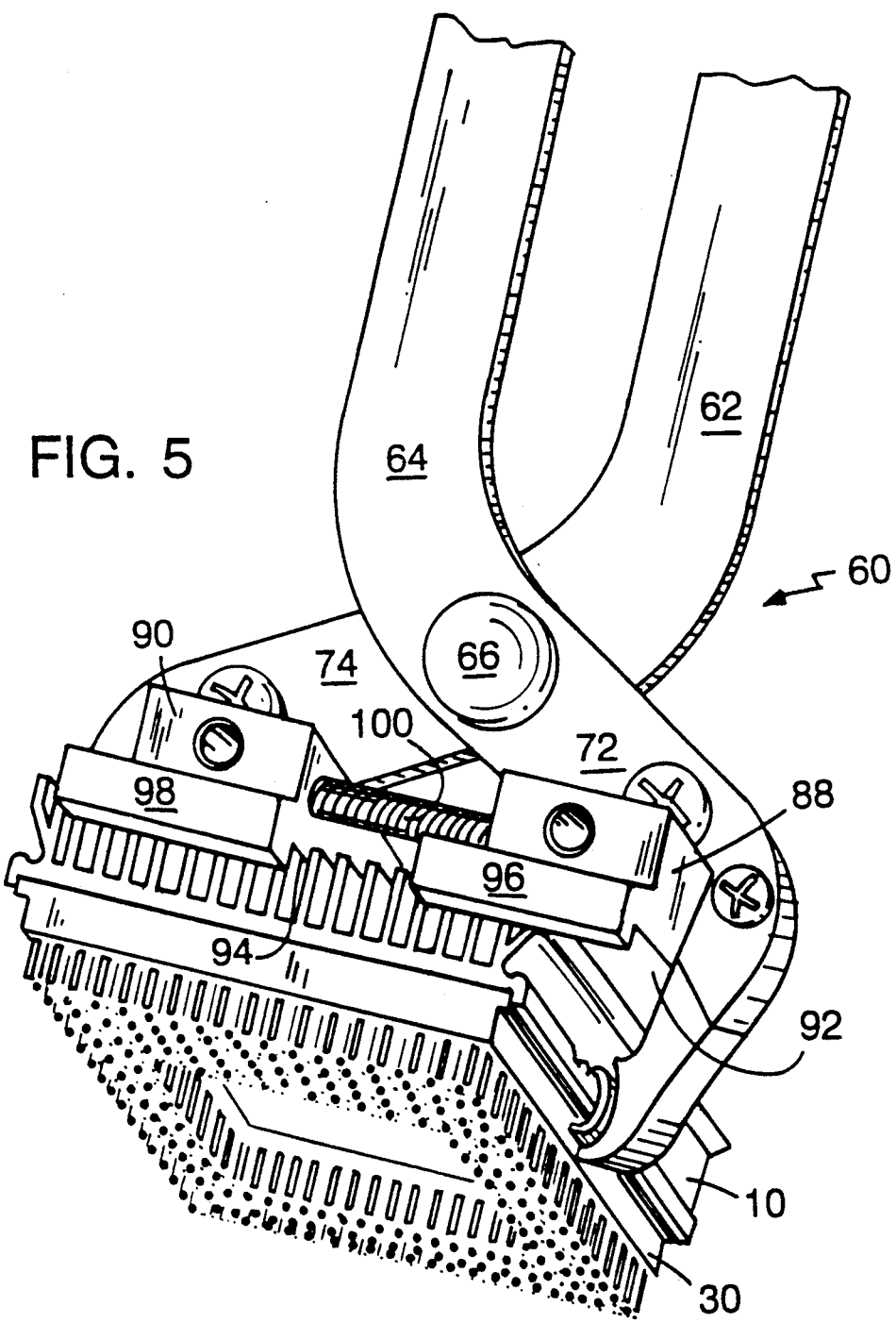
Figure 6:
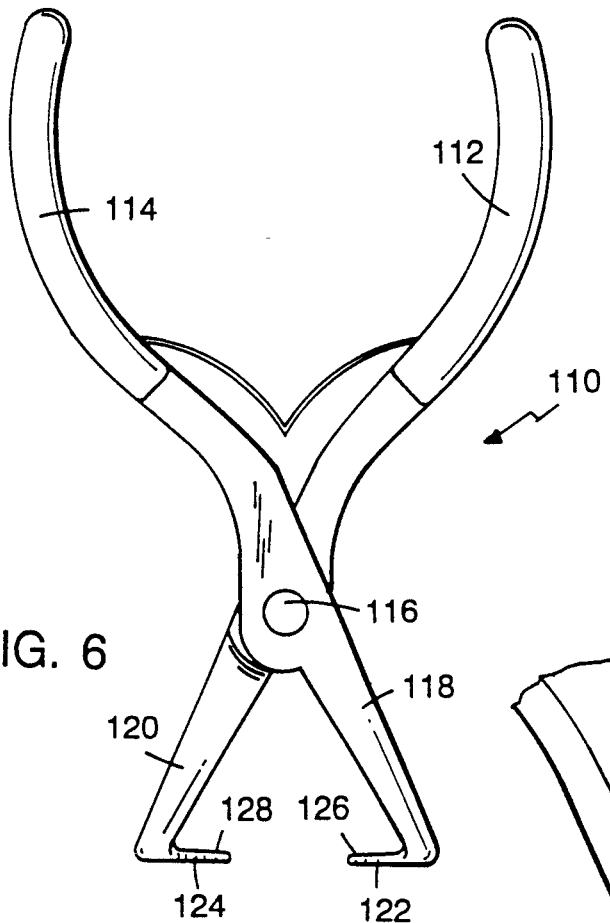

FIGS. 3A, 3B, and 3C are enlarged views of a portion of the heat sink of FIG. 2, showing the attachment of a clip to a pin grid array;

FIG. 4 is a perspective view of a pair of attachment pliers of this invention;

FIG. 5 is a side view of the pliers of FIG. 4 disposed to attach a pair of clips to a heat sink and a pin grid array;

FIG. 6 is a perspective view of a pair of removal pliers of this invention; and

Figure 7:
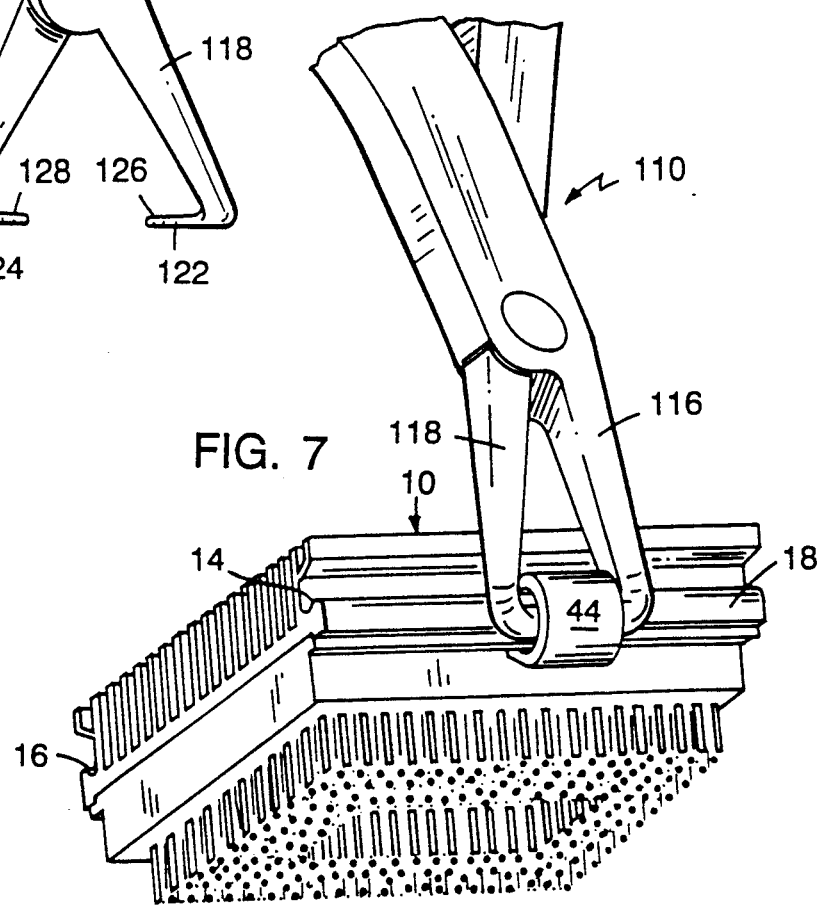

FIG. 7 is a view of the pliers of FIG. 6 disposed to remove a clip connecting a heat sink to a pin grid array.

STRUCTURE

Figure 1:
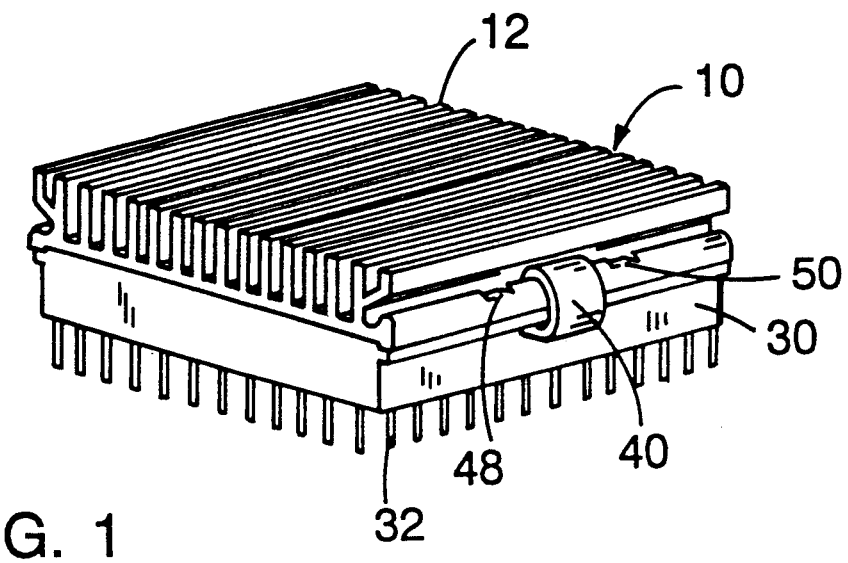
FIG. 1 is a perspective view of a heat sink and a pin grid array connected together by clips.

Referring to FIGS. 1 and 2, a heat sink according to the invention is disclosed at 10. The heat sink 10 is fin type heat sink having a series of parallel, extending fins 12 to dissipate heat mounted on a base 13. It should be understood, however, that this type of heat sink is shown for illustration only, and other types of heat sinks may be used with this invention. As shown in FIG. 1, the heat sink 10 is attached to a pin grid array 30 by a pair of clips 40 (only one shown). The pin grid array 30 has a series of projecting pins 32 and is adapted to receive a semiconductor (not shown) on its face opposite the heat sink 10. With the semiconductor, the pin grid array 30 is designed to be attached to a printed circuit board ( also not shown) by soldering its pins 32 to the board.

As best shown in FIG. 2, a pair of grooves 14, 16 are disposed along opposite sides of the heat sink 10. The grooves 14, 16 extend the length of the heat sink 10 and are bounded along their entire lengths by a pair of lips 18, 20. The depth and configuration of the grooves 14, 16 depend upon the type of clip to be used to attach the heat sink 10 to the pin grid array 30. In the preferred embodiment, the clip 40, shown in FIGS. 3B and 3C, is of the general type disclosed in U.S. patent application No. 07/609,265, now U.S. Pat. No. 5,099,550, except that the clip 40 is about one half inch in length. Other lengths are, of course, possible. As shown in FIGS. 3B and 3C, the clip 40 has a rounded top 42, an outwardly curved back 44, and a lower ledge 46. The clip 40 is somewhat flexible. The grooves 14, 16 are configured to receive the rounded top 42 of the clip 40. While the top 42 can slide in the groove 14 along the length of the groove, the curvature of the back 44 and the positioning of the ledge 46 are such that the top 42 cannot fall out of the groove 14 away from its ends.

As shown in FIG. 1, groove 14 has a pair of indentations 48, 50 disposed on opposite sides of each clip 40. The opposite groove 16 has an identical pair of indentations (not shown). The indentation 48 is best shown in FIG. 3A, and the other indentations are identical. Essentially, as shown in FIG. 3A, the indentation 48 projects into the groove 14 a sufficient distance to prevent the rounded top 42 of the clip 40 from sliding past the indentation 48 in the groove 14. In the preferred embodiment, the indentations 48, 50 are made by a centerpunch on each side of the clip 40, once the clip 40 is slipped into the groove 14 and positioned where desired in the groove 14. Once the indentations 48, 50 are made, the clip 40 will not slide out of the groove 14, and it will stay in place on the heat sink 10, although it is somewhat loosely held.

Referring to FIGS. 4 and 5, a pair of attachment pliers is shown at 60. The pliers 60 comprise a pair of handles 62, 64 connected at a pivot point by a pin 66. A pair of compression sections 68, 70 are disposed opposite the handles 62, 64. The sections 68, 70 comprise a pair of first extensions 72, 74 and a pair of second extensions 76, 78. The second extensions 76, 78 each have points 80, 82, each of which include a concave indentation 84, 86 generally configured to fit over the back 44 of a clip 40. The pliers 60 also include a pair of blocks 88, 90 attached to the extensions 76, 78, which blocks 88, 90 each have a seating face 92, 94 and a pair of projecting lips 96, 98 (only one pair shown, see FIG. 5). The dimensions of the blocks 88, 90 are selected so that the heat sink 10 to be attached seats on the faces 92, 94 and within the lips 96, 98, preferably with a slight clearance. The blocks 88,90 are connected by a spring 100.

Referring to FIGS. 6 and 7, a pair of removal pliers is shown at 110. The pliers 110, which are similar to needle-nose pliers, comprise a pair of handles 112, 114 connected at a pin 116. A pair of extensions 118, 120 extend from the handles 112, 114 on the opposite side of the pin 116. The extensions 118, 120 each have an end section 122, 124, which are generally "L" shaped with a pair of tapered points 126, 128 which are disposed so that they project towards each other.

In the attachment operation, the tops 42 of the clips 40 are slipped into the grooves 14, 16 on the heat sink 10 to be attached to the pin grid array 30. In general, one or two clips 40 are used for each groove 14, 16. The positioning of the clips 40 in the grooves 14, 16 may depend upon where the pin grid array 30 will ultimately be located on the printed circuit board, and as a result, the clips 40 may be positioned anywhere in the grooves 14, 16 except at the very ends. Once a clip 40 is positioned in a groove 14, the pair of indentations 48, 50 are made by a centerpunch on either side of the clip 40. The clip 40 is thereby held in place in the groove 40, as the top 42 of the clip 40 cannot slip past the indentations 48, 50 in the groove 14. This is done for all the clips to be attached to the heat sink.

Once the clips 40 are so attached to the heat sink 10, the heat sink 10 and the clips 40 are in effect a single unit which can easily be handled by an assembler. That unit is then arranged so that the top of the fins 12 of the heat sink 10 are seated against the faces 92, 94 of the blocks 88, 90 of the attachment pliers 60. When so located, the concave indentations 84, 86 on the pliers' points 80, 82 fit over the concave backs 44 of the clips 40 on the heat sink 10, as shown best in FIG. 4. At that point, the clip 40 is disposed in the position shown in FIG. 3B. A slight compression of the handles 62, 64 of the attachment pliers 60 serves to hold the heat sink 10 and clips 40 in place, as shown in FIG. 4. The assembler then places the bottom of the pin grid array 30 opposite its pins 32 against the heat sink, as shown in FIG. 3B. Once the pin grid array 30 is in place, the assembler squeezes the handles 62, 64 of the attachment pliers 60. This compresses the clips 40 on both sides of the heat sink 10 simultaneously and forces the ledges 46 of the clips 40 over the top edge of the pin grid array 30, as shown in FIG. 3C. (The clip 40 is somewhat flexible and deforms slightly (not shown) as it compresses against the pin grid array 30.). As a result, the clips 40 hold the pin grid array 30 to the heat sink 10. The pliers 60 are then removed, and the pin grid array 30 and heat sink 10 can be attached to a printed circuit board, once the semiconductor is connected to the pin grid array 30, if the pin grid array 30 is not already mounted on the board. It should be appreciated that in some instances the heat sink 10 is attached to a pin grid array 30 already mounted on a board. In that case, it should be noted that the attachment pliers 60 do not exert a downward or vertical force on any such board when attaching the clips 40 to the pin grid array 30, and therefore, the board will not be flexed, which can have an adverse affect on the thin electrical paths deposited on the board.

The removal pliers 110 are used to remove the heat sink 10 from the pin grid array 30. As shown in FIG. 7, the pliers 110 are positioned so that their tapered points 126, 128, which project toward each other, are disposed underneath the back 44 of the clip 40 between the back 44 and the lip 18 of the groove 14 of the heat sink 10. As shown in FIG. 3C, there is a space between the concave back 44 and the heat sink 10 when the clip 40 is in place, and the plier points 126, 128 fit in that space from both ends of the clip 40. Compressing the handles 112, 114 of those pliers 110 forces the tapered points 126, 128 together. As they have an increasing taper, the points 126, 128 expand the space between the clip 40 and the heat sink 10, eventually pulling the ledge 46 away from the pin grid array 30 and disconnecting the clip 40. Once all the clips 40 on one side of the heat sink 10 are disconnected, that side of the heat sink 10 can be pulled away from the pin grid array 30, which action will disconnect the clips 40 on the other side. Since, the clips 40 are still held in place by the indentations 48, 50, they do not become loose and fall onto the printed circuit board.

Other variations will occur to those skilled in the art.

What we claim is:

1. A heat sink for attaching to a pin grid array comprising:
    a heat dissipating portion, and
    a base having sides,
        said heat dissipating portion being integrally connected to said base, said base having at least two lips, each said lip being adjacent to a different side of said base, each said lip forming a groove between said lip and the remainder of said base, each said groove receiving a means for attaching said heat sink to a pin grid array, each said groove including at least one indentation, said indentation at least partially blocking said groove so that said indentation operates to hold said means for attaching in said groove so that said heat sink and said means for attaching may be held as a single unit for assembly and disassembly with the pin grid array.

2. The heat sink of claim 1 wherein said base is rectangular having four sides, each said groove and each said lip extending the length of one side of said base of said heat sink.

3. The heat sink of claim 1 wherein said means for attaching comprises at least one clip.

4. The heat sink of claim 1 wherein a pair of indentations are used, said indentations being disposed on opposite sides of said means for attaching.

* * * * *